United States Patent [19]

Kobayashi et al.

[11] Patent Number: 4,754,175

[45] Date of Patent: Jun. 28, 1988

[54] SOLID STATE RELAY HAVING A THYRISTOR DISCHARGE CIRCUIT

[75] Inventors: Shigeki Kobayashi; Kenji Ogawa; Tetsuo Yoshino, all of Tokyo, Japan

[73] Assignee: NEC Corporation, Japan

[21] Appl. No.: 937,330

[22] Filed: Dec. 3, 1986

[30] Foreign Application Priority Data

Dec. 4, 1985 [JP] Japan ................................ 60-273921
Jun. 21, 1986 [JP] Japan ................................ 61-145697

[51] Int. Cl.[4] ..................... H03K 17/687; H03K 3/43; G02B 27/00
[52] U.S. Cl. .................................. 307/570; 307/637; 307/571; 307/311; 250/551
[58] Field of Search ................. 307/570, 571, 252 C, 307/252 G, 311, 280, 300, 633, 637; 250/551

[56] References Cited

U.S. PATENT DOCUMENTS

| 4,419,586 | 12/1983 | Phipps | 307/311 |
| 4,481,434 | 11/1984 | Janutka | 307/570 |
| 4,500,801 | 2/1985 | Janutka | 307/570 |
| 4,564,770 | 1/1986 | Sherman et al. | 307/311 |

Primary Examiner—Stanley D. Miller
Assistant Examiner—B. P. Davis
Attorney, Agent, or Firm—Laff, Whitesel Conte & Saret

[57] ABSTRACT

A solid state relay comprises a light-emitting diode (2) for generating radiation in response to forward current supplied thereto and an array (5) of photodiodes optically coupled to the light-emitting diode for generating a voltage in response to radiation from the light-emitting diode. A thyristor (18) is provided having anode and cathode coupled to the gate and substrate electrodes (11a, 11b, 14a, 14b) of a field-effect transistor, respectively. A gate electrode (21) of the thyristor is connected to one end (7) of the photodiode array (5) and the cathode of the thyristor is further connected to the other end (8) of the photodiode array. The voltage generated by the photodiode array is applied to the switching transistor (9, 10) through a diode (17) so that the impedance between the source and drain electrodes of the transistor has a low value in the presence of the voltage and a high value in the absence of the voltage. A voltage photogerated by the array in response to radiation from the light-emitting diode forwardly biases the diode (7) and backwardly biases the thyristor, so that it is applied to the transistor without loss of energy. Upon cessation of the radiation, a voltage difference between the photodiode array and the transistor backwardly biases the diode (7) and forwardly biases the thyristor, providing a low impedance path for rapidly discharging energy stored in the transistor to cause it to turn off.

12 Claims, 4 Drawing Sheets

SOLID STATE RELAY HAVING A THYRISTOR DISCHARGE CIRCUIT

BACKGROUND OF THE INVENTION

The present invention relates to a solid state relay capable of high speed switching operation.

For solid state switching application, metal-oxide-semiconductor (MOS) field-effect transistors are employed as switching elements to take advantage of their high speed switching capability. One typical example of such solid state switching devices or relays is shown and described in U.S. Pat. No. 4,227,098 issued to Brown et al. This relay comprises a light-emitting diode connected between a pair of input terminals, an array of photodiodes series connected between the gate electrode and substrate electrode of a MOS field-effect transistor. The photodiode array is optically coupled to the light-emitting diode to generate a voltage in response to radiation therefrom when a forward current is supplied to the input terminals. The source and drain (current carrying electrode) of the transistor are connected respectively to a pair of output terminals. In the absence of the voltage, the impedance between the output terminals is high representing an open circuit and in the presence of the voltage the impedance is low representing a contact closure. A resistor is connected across the gate and substrate electrodes (voltage receiving electrodes) of the transistor to discharge energy stored therein to allow the transistor to turn off rapidly in response to the turn-off the light-emitting diode. Since the discharge resistor is also in parallel connection with the photodiode array, however, there is a loss of voltage which is applied to the transistor, resulting in an increase in the turn-on time.

Another solid state relay is disclosed in U.S. Pat. No. 4,390,790 issued to Rodriguez. This relay comprises an enhancement mode MOS field-effect transistor as a switching element and a depletion mode MOS field-effect transistor having current carrying electrodes connected to the voltage receiving electrodes of the switching transistor to provide a discharge path. This solid state relay additionally includes a second array of photodiodes optically coupled to the light-emitting diode to provide a photogenerated voltage to the gate electrode of the depletion mode MOS field-effect transistor to turn it off in response to the turn-on of the light-emitting diode. The voltage generated by the first photodiode array in response to the turn-on of light-emitting diode causes the enhancement mode switching transistor to turn on. Thus, the voltage supplied from the first photodiode array to the switching transistor in response to the turn-on of the light-emitting diode encounters no loss. A discharge resistor is connected across the second photodiode array to enable discharge of the depletion mode transistor upon turn-off of the light-emitting diode to allow it turn on to provide a discharge path for the energy stored in the enhancement mode switching transistor. Since the impedance of the discharge path is much smaller than the discharge resistor of U.S. Pat. No. 4,227,098, a faster turn-off operation can be achieved.

However, the solid state relay of U.S. Pat. No. 4,390,790 is still not satisfactory in terms of both turn-on and turn-off times. More specifically, the normally turn-on condition of the depletion mode discharge transistor tends to adversely affect on the second photodiode array so that its photogenerated voltage is prevented from rising sharply in response to the reception of radiation from the light-emitting diode. In addition, the discharge resistor connected across the second photodiode array presents a bypass current flow passage which tends to counteract the storage of energy on the gate electrode of the depletion mode transistor. As a result, the turn-on time of the depletion mode transistor is about 600 microseconds, a value which is too large for high speed switching applications. Likewise, during the turn-off of the relay, the energy stored in the depletion mode transistor must be discharged through the resistor before the enhancement mode switching transistor is turned off. A typical turn-off time of the prior art solid state relay is also 600 microseconds.

SUMMARY OF THE INVENTION

Accordingly, an object of the present invention is to provide a solid state relay having fast turn-on and fast turn-off switching capabilities not attainable with prior art solid state relays.

Briefly described, this object is obtained by the use of a thyristor for providing a high-impedance, normally turn-off state for enabling a field-effect switching transistor to turn on quickly in response to application of a photogenerated voltage and providing a low-impedance turn-on state for enabling energy stored in the switching transistor to be discharged for it to turn off quickly in response to the cessation of the photogenerated voltage.

Specifically, the solid state relay of the present invention comprises a pair of input terminals and a light-emitting diode connected to the input terminals for generating radiation in response to current applied to the input terminals. An array of photodiodes, is connected between first and second device electrodes (array electrodes) and optically coupled to the light-emitting diode for generating a voltage across the device electrodes in response to radiation from the light-emitting diode. A field effect transistor including a pair of current carrying electrodes (source and drain) and first and second voltage receiving electrodes (gate and substrate electrodes) is provided. A thyristor is provided having first and second current carrying electrodes (anode and cathode) and a control gate, the first and second current carrying electrodes of the thyristor being coupled to the first and second voltage receiving electrodes of the transistor, respectively, and the control gate being connected to the first device electrode. The second current carrying electrode of the thyristor is further connected to the second device electrode. A unidirectional conducting device is connected between the first device electrode and the first voltage receiving electrode of the transistor for applying said voltage to the voltage receiving electrodes of the transistor. A pair of output terminals are respectively connected to the current carrying electrodes of the transistor.

In operation, application of a forward current to the input terminals causes the light-emitting diode to generate radiation which in turn causes a voltage to be photogenerated by the photodiode array. The photogenerated voltage forwardly biases the unidirectional conducting device and backwardly biases the control gate of the thyristor, so that it is applied through the unidirectional conducting device to the voltage receiving electrodes of the transistor without loss of energy by the thyristor, allowing the transistor to be rapidly turned on. Upon removal of the forward current from the input terminals, a voltage difference between the photodiode array and the transistor backwardly biases the unidirectional conducting device and forwardly biases the control gate of the thyristor, providing a low impedance path for rapidly discharging the energy stored in the transistor to cause it to turn off.

BRIEF DESCRIPTION OF THE DRAWINGS

The present invention will be described in further detail with reference to the accompanying drawings, in which.

DETAILED DESCRIPTION

Figure 1:
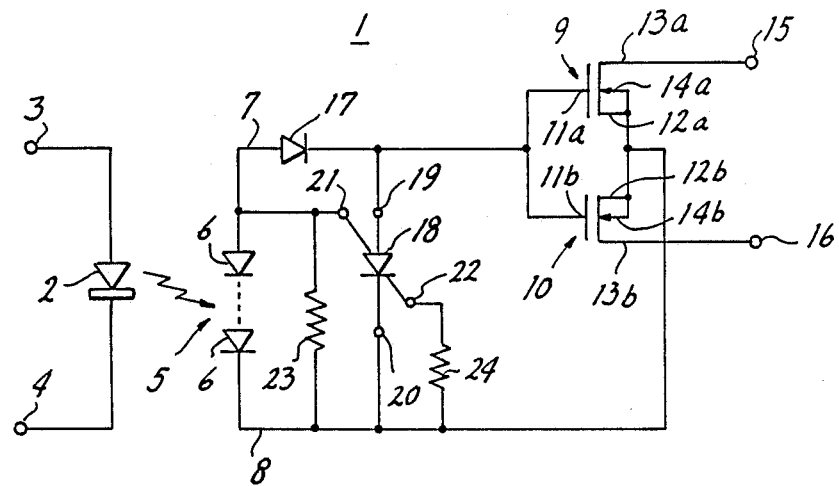
FIG. 1 is a circuit diagram of a first embodiment of the solid state relay of the invention.

Referring now to FIG. 1, there is shown a first embodiment of the solid state relay circuit of the present invention. The relay circuit 1 comprises a light-emitting diode 2 having a cathode and an anode respectively connected to input terminals 3 and 4 corresponding to the coil terminals of an electromagnetic relay. An array 5 of series-connected photodiodes 6 is connected between a pair of positive electrode 7 and negative electrode 8 with the positive electrode 7 being connected to the anode of the photodiode at one end of the array and the negative electrode 8 being connected to the cathode of the photodiode at the other end of the array. A pair of double-diffused metal-oxide-semiconductor field-effect transistors, or DMOSFETs 9 and 10 are provided each having a gate electrode 11, a pair of current carrying electrodes (source and drain) 12 and 13, and a substrate electrode 14. Source electrodes 12a and 12b and substrate electrodes 14a and 14b of the transistors are connected together to electrode 8 and drain electrodes 13a and 13b are connected respectively to output terminals 15 and 16 of the solid state relay circuit. Each of the DMOSFETs 9 and 10 may be either enhancement mode transistors or depletion mode transistors.

Electrode 7 is connected to the anode of a diode 17 to the cathode of which the gate electrodes 11a and 11b of the transistors are connected together. Across the electrode 8 and the cathode of diode 17 is connected a four-layer p-n-p-n diode or four-terminal thyristor 18 having an anode 19 connected to the outer p-type conductivity layer, a cathode 20 connected to the outer n-type conductivity layer, a negative gate 21 connected to the inner n-type conductivity layer and a positive gate 22 connected to the inner p-type conductivity layer. The anode 19 of thyristor 18 is connected to the cathode of diode 17, the cathode 20 being connected to electrode 8. A discharge resistor 23 is connected between positve and negative electrodes 7 and 8 to enable the photodiodes 6 to discharges voltage developed therein. The negative gate 21 of thyristor 18 is connected to electrode 7, the positive gate 22 being connected to electrode 8 by a resistor 24. The connection of negative gate 21 of the thyristor to positive electrode 7 causes it to be biased into a turn-off condition when the photodiode array 5 develops a voltage thereacross. Photodiode array 5 is optically coupled to the light-emitting diode 2 to receive radiation emitted thereby.

The operation of the solid state relay circuit of FIG. 1 will now be described. It is assumed that the DMOS field-effect transistors 9 and 10 are N-channel enhancement mode transistors. In the absence of current flow between the input terminals 3 and 4, no voltage is developed across the array electrodes 7 and 8 and consequently the impedance across the output terminals 15 and 16 is high representing an open contact condition. The application of a forward current of sufficient magnitude between the input terminals 3 and 4 causes the light-emitting diode 2 to emit radiation. The series connected photodiode array 5 develops across the positive and negative electrodes 7 and 8 a voltage which is the sum of voltages developed in each of the individual photodiodes. Since the voltage between the array electrodes 7 and 8 forwardly biases the diode 17 and backwardly biases the thyristor 18, the gate electrodes 11a, 11b are driven positively with respect to the substrate electrodes 14a, 14b, and therefore a low impedance channel is established between the drain electrodes 13a and 13b, completing a circuit between the output terminals 15 and 16 equivalent to a contact closure of an electromagnetic relay. The removal of the forward current from the input terminals 3 and 4 causes the light-emitting diode 2 to extinguish the radiation, so that the voltage between the array electrodes 7 and 8 is discharged through the resistor 23 and the diode 17 is backbard biased, and the junction of anode 19 and gate 21, of the thyristor is forwardly biased. The forward biasing of the thyristor junction between electordes 19 and 21 is effected by the charge stored in the transistors 9 and 10. Photodiode array 5 provides a low impedance return path to the transistors 9 and 10, causing the voltage across array electrodes 7 and 8 to decrease rapidly the voltage between array electrodes 7 and 8 becomes lower than the voltages at the gate electrodes 11a, 11b of the transistor pair (typically, 0.6 volts lower than the gate voltage), the thyristor 18 is turned on establishing a low impedance path between anode 19 and cathode 20 which will be maintained due to the thyristor's regenerative action until the voltage across its anode and cathode drops to a 1-volt level. As a result, the voltages at the gate electrodes of the transistor pair are rapidly discharged through the now conducting thyristor 18. The turn-on of thyristor 18 also provides a rapid discharging path for charges that remain in the photodiodes 6 and charges developed across the diode 17. It was shown that the solid state relay of the invention turns off at a speed which is ten times higher than the prior art solid state relay. The function of resistor 24 is to enable the thyristor 18 to switch to the turn-on state with a response characteristic or a desired noise immunity characteristic. With a resistor 24 having a relatively high value, the thyristor 18 turns on at a small gate current threshold but suffers from reduced immunity to noise. The low value of resistor 24, on the other hand, degrades the response characteristic of the thyristor but improves its noise immunity performance. Thus, the resistor 24 must be chosen at a value which is a compromise between the two conflicting factors.

Figure 2:
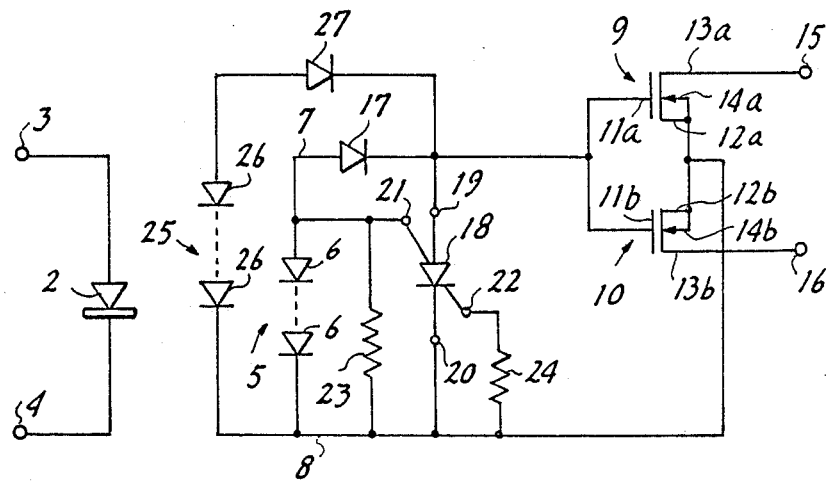
FIG. 2 is a circuit diagram of a second embodiment of the invention.

A second embodiment of the present invention is illustrated in FIG. 2 in which parts corresponding to those in FIG. 1 are identically designated. The second embodiment is similar to the first embodiment with certain modifications. The embodiment of FIG. 2 is suitable for high speed operation and this is achieved by increasing the current capacity of photodiodes without substantially increasing the total area occupied by the photodiodes. This embodiment includes a second array 25 of series connected photodiodes 26 and a second diode 27 which are connected in series between the gate electrodes 11a, 11b of the transistor pair and the negative electrode 8 with the anode of second diode 27 being connected to the anode of the photodiode at one end of the second array 25 and the cathode of diode 27 being connected to the gate electrodes 11a, 11b. Negative electrode 8 is connected to the cathode of the photodiode at the other end of the second array 25. In this embodiment, photodiodes 6 of the first array are of the type capable of generating a relatively high voltage (much higher than the threshold voltage of transistors 9 and 10) with relatively low current and photodiodes 26 of the second array are of the type capable of generating a relatively low voltage (slightly higher than the threshold voltage) with relatively large current. Due to the relatively large current capacity, the voltages generated by photodiodes 26 in response to the reception of radiation from the light-emitting diode 2 rise at a higher rate than the voltages generated by photodiodes 6.

The operation of the second embodiment is as follows. The application of a forward current to the input terminals 3 and 4 causes the light-emitting diode 2 to emit radiation which is received by the photodiodes of both arrays, causing voltages to be developed therein at different rates. The voltage developed by the second photodiode array 25 rises rapidly to a level slightly higher than the threshold of transistors 9 and 10. Since the second photodiode array is not connected to the discharge resistor 23, there is no loss of voltage that is applied to transistors 9 and 10. Transistors 9 and 10 can therefore be quickly turned on in response to the application of a forward current to the input terminals 3 and 4. Transistors 9 and 10 are subsequently impressed with a higher voltage developed by the first photodiode array 5. Since the diode 27 is backwardly biased, the higher, subsequently generated voltage is impressed to transistors 9 and 10 with a slight voltage drop by diode 17. The application of this higher voltage keeps transistors 9 and 10 from being turned off in response to noise that is superimposed on the input signal. Upon the removal of the forward current from the input terminals 3 and 4, transistors 9 and 10 are turned off in the presence of noise.

Figure 3:
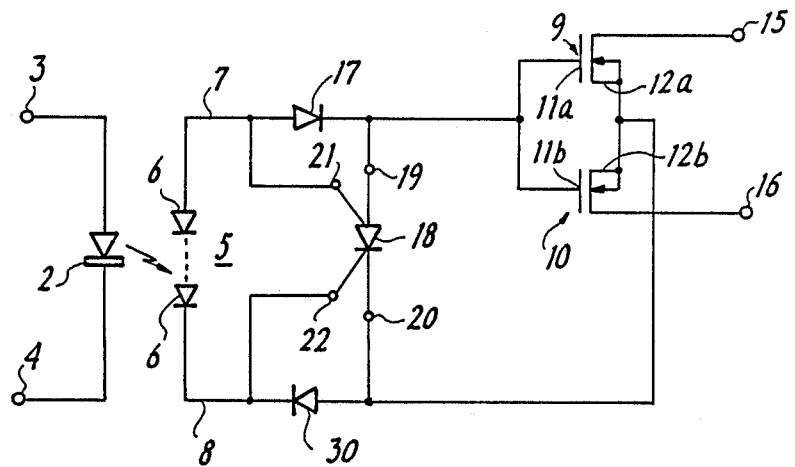
FIG. 3 is a circuit diagram of a third embodiment of the invention.

Referring to FIG. 3 which shows a further modification of the embodiment of FIG. 1 in which parts corresponding to those in FIG. 1 are identically designated. This embodiment differs from the first embodiment in that it employs a second diode 30 having a similar function to that of the first diode 17 and resistors 23 and 24 are dispensed with. The cathode of second diode 30 is connected to the negative electrode 8 and the positive gate 22 of thyristor 18 and the anode of diode 30 is connected to the substrate electrodes 14a, 14b of transistors 9 and 10 and the cathode of thyristor 18. Since resistance elements occupy a much larger area than diodes and transistors on an integrated circuit chip, the elimination of resistance elements makes this embodiment suitable for implementation by integrated circuit technology.

The solid state relay of FIG. 3 operates as follows. When the photodiode array 5 receives radiation from light-emitting diode 2 in response to a forward current to input terminals 3 and 4, the voltage developed by the array is applied to transistors 9 and 10 through diodes 17 and 30. Since there is a current flow in the forward direction of diodes 17 and 30, the negative gate 21 and positive gate 22 of thyristor 18 are backwardly biased with respect to its anode and cathode. This prevents the thyristor from being switched on in response to strong noise that may occur in the input signal. Upon removal of the input current from terminals 3 and 4, the voltage across the photodiode array 5 decreases through the self-discharge action of photodiodes 6 and the diodes 17 and 30 are backwardly biased into turn-off state. As a result, the negative and positive gates 21 and 22 of thyristor 18 switch to a very high impedance state. In this high impedance state, the thyristor can be readily switched on if a slight variation occurs in currents to the negative and positive gates 21 and 22. Consequently, a slight voltage reduction between the array electrodes 7 and 8 due to the self-discharge action of photodiodes 6 causes the negative and positive gates 21 and 22 to be forwardly biased with respect to the anode 19 and cathode 20 to turn on the thyristor 18, enabling the voltage at the gate electrodes 11a, 11b of the transistors and the voltage photogenerated by the array 5 to be quickly discharged.

Figure 4:
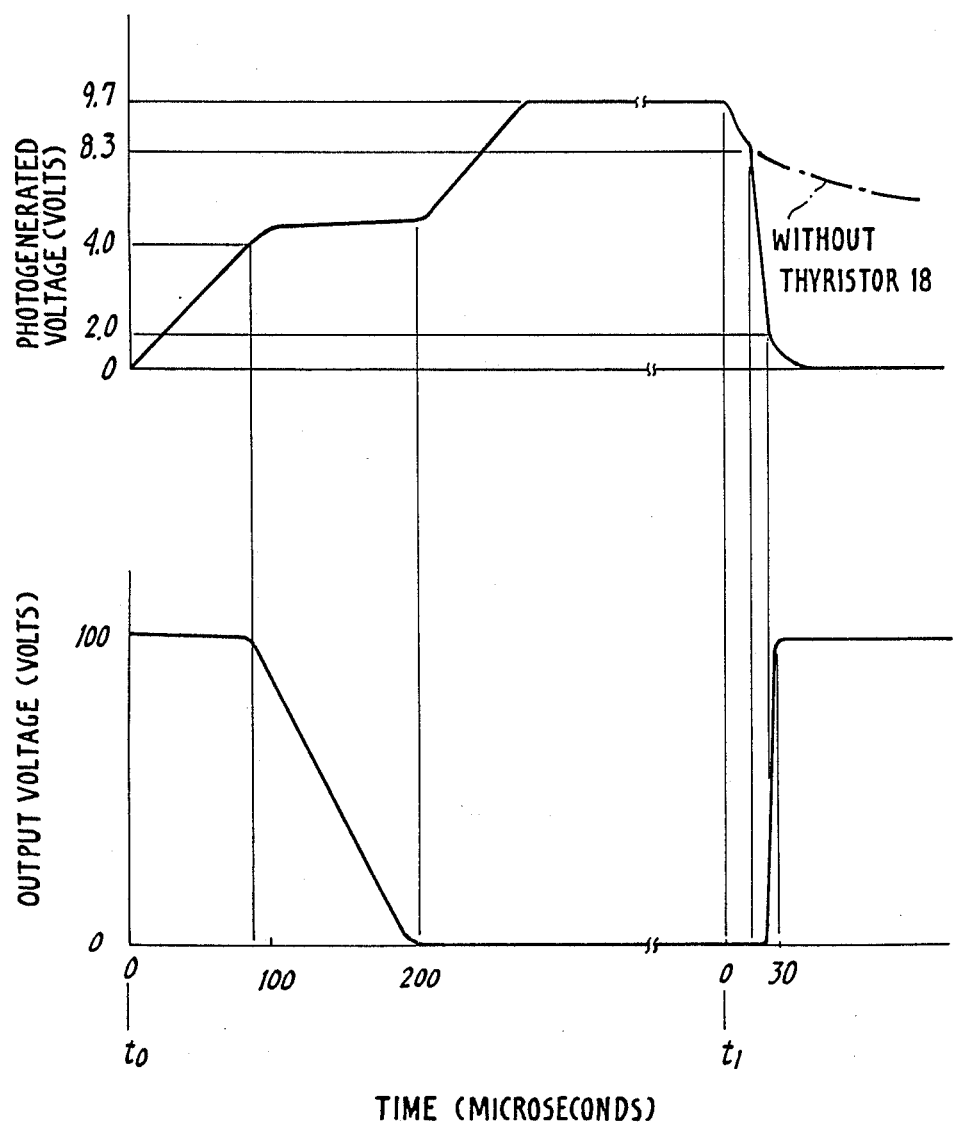
FIG. 4 is a graphic representation of the turn-on and turn-off characteristics of the embodiment of FIG. 3.

FIG. 4 is a graphic representation of the relationship between the photogenerated voltage and the voltage between output terminals 15 and 16 for a solid state relay according to the embodiment of FIG. 3 with the following operating parameters:

Resistance between output terminals 15 and 16 during the on-time of transistors 9 and 10=43 ohms;

Capacitance between the gates 11a, 11b and source electrodes 12a, 12b=66 picofarads;

Capacitance between output terminals 15 and 16=25 picofarads;

Feedback capacitance between the gates 11a, 11b and output terminals 15, 16=18 picofarads; and Photodiode array 5 is constructed of a 4×5 matrix array of photodiodes with a surface area of 200 $\mu$m×200 $\mu$m each.

A DC voltage of 100 volts is applied between terminals 15 and 16 through a load impedance of 10 kiloohms and a forward current of 10 milliamperes is applied to input terminals 3 and 4. In response to emission of radiation from light-emitting diode 2 at time $t_0$, the photogenerated voltage between the array electrodes 7 and 8 rises from zero to 4.0 volts whereupon the transistors 9 and 10 turn on and the output voltage starts decreasing from 100 VDC to zero. The solid state relay is switched on with a response time of 200 microseconds. With the turn-on of transistors 9 and 10, the photogenerated voltage rises again to a steady level of 9.7 volts. Upon cessation of radiation from the light-emitting diode 2 at time $t_1$, the photogenerated voltage decreases from the 9.7-VDC level to an 8.3-VDC level due to the self-discharging action of photodiodes 6 for a period of 15 microseconds. Thyristor 18 is turned on when the 8.3-VDC level is reached, allowing the gate voltage of transistors 9 and 10 to discharge through the conducting thyristor 18, so that the photogenerated voltage as well as the gate voltage of transistors 9 and 10 sharply decreases to a 2.0-VDC level, whereupon the output voltage sharply increases to the 100-VDC level at the end of a period of 30 microseconds following the turn-off of light-emitting diode 2. By the use of a photodiode array having a sufficient current capacity, a turn-on time of 50 microseconds can be obtained.

The embodiment of FIG. 3 can be simplified by omitting one of the diodes 17 and 30 and leaving the associated one of the gate electrodes of thyristor 18 in a high impedance state. The elimination of a diode advantageously reduces the voltage drop, but degrades the noise immunity performance.

Figure 5:
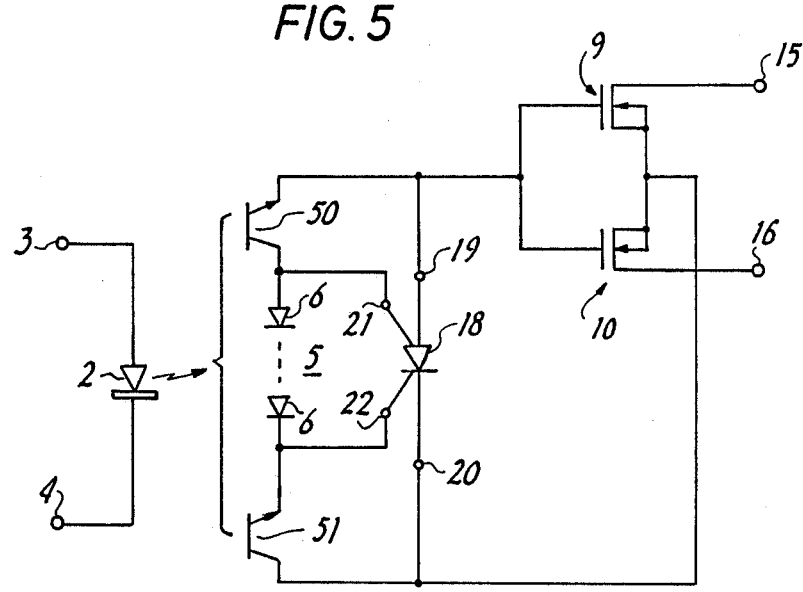
FIG. 5 is a circuit diagram of a modification of the embodiment of FIG. 3.

The solid state relay of FIG. 3 can also be implemented by the use of n-p-n phototransistors 50 and 51 instead of diodes 17 and 30 as shown in FIG. 5. Phototransistors of opposite conductivity type, i.e., p-n-p type can also be used with their collectors and emitters being connected in reverse to that shown in FIG. 5. Photodiodes 50 and 51 are located so that the base of each phototransistor receives radiation from the light-emitting diode 2 to establish a low impedance path between the photodiode array 5 and switching transistors 9 and 10. Since the impedance between the collector and emitter of each phototransistor is significantly lower than the impedance between the anode and cathode of a diode, the bias voltages applied to the gate electrodes 21 and 22 of the thyristor for turn-on operation are lower than those of the embodiment of FIG. 3, with a resultant decrease in noise immunity. However, there is no loss of voltage to be applied to the switching transistors 9 and 10. The turn-off time of this embodiment is somewhat longer than the embodiment of FIG. 3 in that the carriers at the bases of phototransistors need to be annihilated before turning off the transistors 9 and 10.

Figure 6:
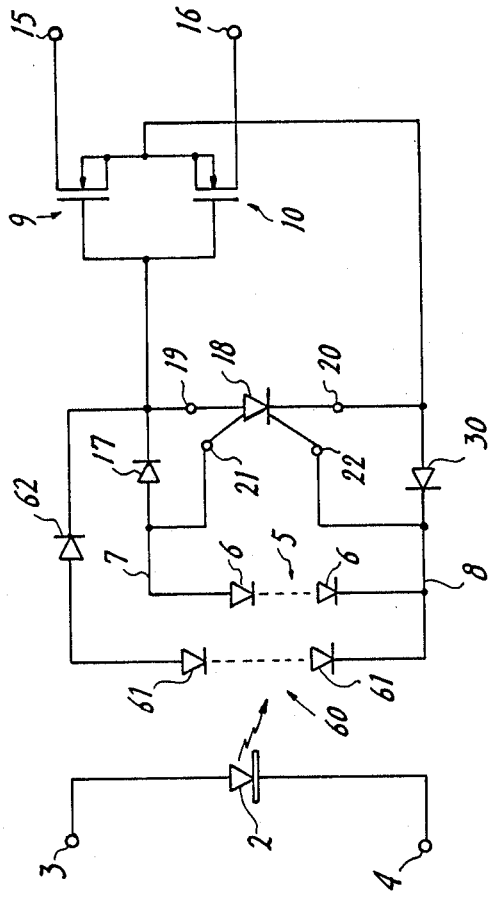
FIG. 6 is a circuit diagram of a modification of the embodiment of FIG. 5.

The turn-on time of the embodiment of FIG. 3 can be improved by the provision of an additional photodiode array 60 of series connected photodiodes 61 as shown in FIG. 6. The anode of the photodiode at one end of the array is connected to the cathode of a diode 62 and the anode of the photodiode at the other end of the array is connected to the negative electrode 8, the cathode of diode 62 being connected to the gate electrodes of transistors 9 and 10. In a manner similar to that described with reference to FIG. 2, photodiodes 6 of the first array are of the type capable of generating a relatively high voltage with relatively low current and photodiodes 61 of the second array are of the type capable of generating a relatively low voltage with relatively large current. Due to the relatively large current capacity, the voltages generated by photodiodes 61 rise at a higher rate than the voltages photogenerated by photodiodes 6. Similarly to the embodiment of FIG. 2, the voltage developed by the second photodiode array 60 rises rapidly to a level slightly higher than the threshold of transistors 9 and 10, which are subsequently impressed with a higher voltage developed by the first photodiode array 5. With this embodiment, a turn-on time of 50 microseconds can be obtained.

Figure 7:
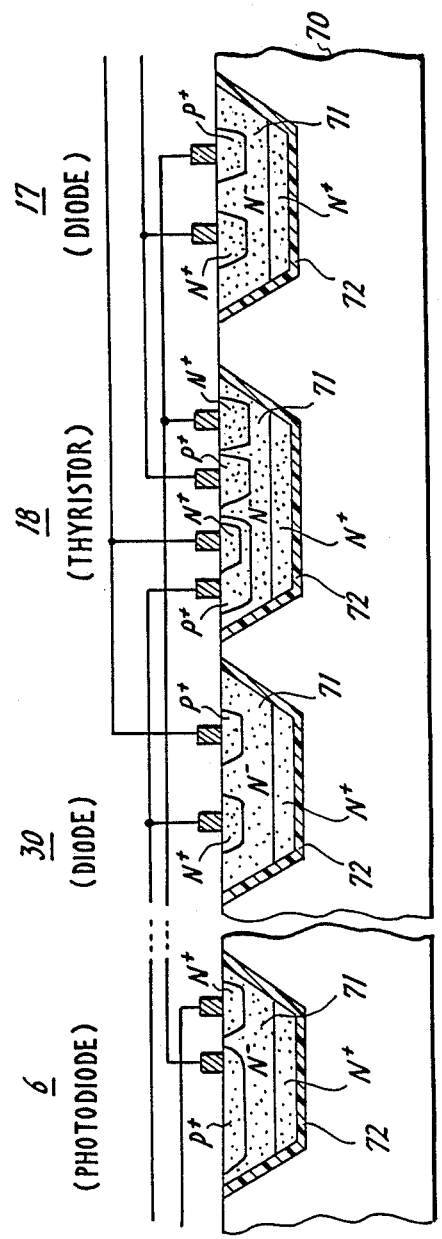
FIG. 7 is a cross-sectional view of an implementation of a solid state relay according to the present invention by an integrated circuit chip.

FIG. 7 is a cross-sectional view of an implementation of the embodiment of FIG. 3 by an integrated circuit chip. The integrated circuit chip comprises a polycrystalline silicon substrate 70 on which the individual elements of the solid state relay are fabricated advantageously using a bipolar-MOS process. Each element is formed by a single crystalline region 71 isolated from the substrate by a silicon dioxide layer 71. Although not shown in FIG. 7, DMOSFETs 9 and 10 can also be fabricated on the same substrate using the same process. Switching transistors can be mounted as many as required on the same substrate or on a separate substrate.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A solid state relay comprising:
   a pair of input terminals;
   a light-emitting diode connected to said input terminals for generating a radiation in response to current applied to said input terminals;
   a first array of photodiodes electrically connected between first and second array electordes and optically coupled to said light-emitting diode for generating a voltage across said array electrodes in response to said radiation from said light-emitting diode;
   a field effect transistor including a pair of current carrying electrodes and first and second voltage receiving electrodes;
   a thyristor including first and second current carrying electrodes and a control gate, said first and second current carrying electrodes of the thyristor being coupled to said first and second voltage receiving electrodes, respectively, said control gate being connected to said first first array electrode and said second current carrying electrode of the thyristor being further connected to said second array electrode;
   a first unidirectional conducting device connected between said first array electrode and said first voltage receiving electrode of said transistor for applying said voltage through said first unidirectional conducting device to said voltage receiving electrodes of said transistor;
   a pair of output terminals respectively connected to said current carrying electrodes of said transistor;
   a second array of photodiodes optically coupled to said light-emitting device and having a current capacity which is greater than the current capacity of said first photodiode array for generating, in response to said radiation from said light-emitting diode, a voltage which is lower than the voltage generated by said first photodiode array; and
   a second unidirectional conducting device connected to said second phtodiode array in a series circuit which is connected in a parallel relationship with said first photodiode array and said first unidirectional conducitng device, whereby the voltage generated by said second photodiode array is applied first through said second unidirectional conducting device to said voltage receiving electrodes of said transistor followed by the application of a voltage form said first photodiode array.

2. A solid state relays as claimed in claim 1, wherein said thyristor has a second control gate, further comprising means for providing a resistive impedance between said array electrodes, and means for providing a resistive impedance between said second control gate of the thyristor and said second array electrode.

3. A solid state relay as claimed in claim 1, wherein said unidirectional conducting device is a diode.

4. A solid state relay as claimed in claim 1, wherein said transistor is a metal-oxide-semiconductor field effect transistor.

5. A solid state relay comprising;

a pair of input terminals;

a light-emitting diode connected to said input terminals for generating a radiation in response to current applied to said input terminals;

an array of photodiodes electrically connected between first and second array electrodes and optically coupled to said light-emitting diode for generating a voltage across said array electrodes in response to said radiation from said light-emitting diode;

a field effect transistor including a pair of current carrying electrodes and first and second voltage receiving electrodes;

a thyristor including first and second current carrying electrodes and first and second control gates, said first and second current carrying electrodes of the thyristor being coupled to said first and second voltage receiving electrodes, respectively, said first control gate being connected to said first array electrode and said second current carrying electrode of the thyristor being further connected to said second array electrode, means for providing a resistive impednace between said second control gate and said second array electrode;

a unidirectional conducting device connected between said first array electrode and said first voltage receiving electrode of said transistor for applying the voltage generated by said photodiode array to said voltage receiving electrodes of said field-effect transistor;

a pair of output terminals respectively connected to said current carrying electrodes of said field-effect transistor; and means for providing a resistive impedance between said aray electrodes.

6. A solid state relay as claimed in claim 5, wherein said field-effect transistor is a metal-oxide-semiconductor field effect transistor.

7. A solid state relay comprising;

a pair of input terminals;

a light-emitting diode connected to said input terminals for generating a radiation in response to current applied to said input terminals;

an array of photodiodes electrically connected between first and second array electrodes and optically coupled to said light-emitting diode for generating a voltage across said array eletrodes in response to said radiation from said light-emitting diode;

a field effect transistor including a pair of current carrying electrodes and first and second voltage receiving electrodes;

a thyristor including first and second curent carrying electrodes and a control gate, said first and second current carrying electrodes of the thyristor being coupled to said first and second voltage receiving electrodes, respectively, said control gate being connected to said first array electrode and said second current carrying electrode of the thyristor being further connected to said second array electrode;

a phototransistor electrically coupled between said first array electrode and said first voltage receiving electrode of said field-effect transistor and optically coupled to said light-emitting diode for applying the voltage generated by said phtodiode array to said voltage receiving electrodes of said field-effect transistor; and a pair of output terminals respectively connected to said current carrying electrodes of said field-effect transistor.

8. A solid state relay as claimed in claim 7, wherein said field-effect transistor is a metal-oxide-semiconductor field effect transmistor.

9. A solid state relay comprising;

a pair of input terminals;

a light-emitting diode connected to said input terminals for generating a radiation in response to current applied to said input terminals;

an array of photoiodes electrically connected between first and second array electrodes and optically coupled to said light-emitting diode for generating a voltage across said array electrodes in response to said radiation from said light-emitting diode;

a field effect transistor including a pair of current carrying electrodes and first and second voltage receiving electrodes;

a thyristor including first and second current carrying electrodes and first and second control gates, said first and second current carrying electrodes of the thyristor being coupled to said first and second voltage receiving electrodes, respectively, said first control gate being connected to said first array electrode and said second current carrying electrode of the thyristor, being further connected to said second array electrode, said second control gate being connected to said second array electrode;

a first unidirectional conducting device connected between said first array electrode and said first voltage receiving electrode of said transistor for applying the voltage developed by said photodiode array to said voltage receiving electrodes of said transistor;

a second unidirecitonal conducting device connected between said second current carrying electrode of said thyristor and said second array electrode; and a pair of output terminals respectively connected to said current carrying electrodes of said field-effect transistor.

10. A solid state relay as claimed in claim 9, wherein said second unidirectional conducting device is a diode.

11. a solid state relay as claimed in claim 9, wherei nsaid second unidirectional conducting device is a phototransistor optically coupled to said light-emitting diode.

12. A solid state relay as claimed in claim 9, wherein said field-effect transistor is a metal-oxide-semiconductor field effect transistor.

* * * * *